*(12)* United States Patent
Mok et al.

(10) Patent No.: US 9,159,398 B2
(45) Date of Patent: Oct. 13, 2015

(54) MEMORY CORE AND SEMICONDUCTOR MEMORY DEVICE INCLUDING THE SAME

(71) Applicant: Samsung Electronics Co., Ltd., Suwon-si (KR)

(72) Inventors: Jung-Il Mok, Uiwang-si (KR); Jong-Hyoung Lim, Seoul (KR); Dae-Sun Kim, Hwaseong-si (KR); Ji-Hyun Lee, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 153 days.

(21) Appl. No.: 14/147,545

(22) Filed: Jan. 5, 2014

(65) Prior Publication Data

US 2014/0198589 A1    Jul. 17, 2014

(30) Foreign Application Priority Data

Jan. 11, 2013    (KR) ........................ 10-2013-0003190

(51) Int. Cl.
| | |
|---|---|
| *G11C 7/00* | (2006.01) |
| *G11C 11/4076* | (2006.01) |
| *G11C 7/06* | (2006.01) |
| *G11C 7/12* | (2006.01) |
| *G11C 11/4097* | (2006.01) |
| *G11C 11/408* | (2006.01) |
| *G11C 11/4091* | (2006.01) |
| *G11C 11/4094* | (2006.01) |

(52) U.S. Cl.
CPC .............. *G11C 11/4076* (2013.01); *G11C 7/06* (2013.01); *G11C 7/12* (2013.01); *G11C 11/4085* (2013.01); *G11C 11/4091* (2013.01); *G11C 11/4094* (2013.01); *G11C 11/4097* (2013.01)

(58) Field of Classification Search
CPC ........... G11C 11/4076; G11C 11/4085; G11C 11/4091; G11C 11/4094; G11C 11/4097; G11C 7/06; G11C 7/12
USPC .................. 365/185.11, 203, 207, 189.08
See application file for complete search history.

(56) References Cited

U.S. PATENT DOCUMENTS

| | | | |
|---|---|---|---|
| 7,447,088 B2* | 11/2008 | Yi ................................. | 365/201 |
| 7,495,983 B2 | 2/2009 | Kim | |
| 7,894,241 B2 | 2/2011 | Lee et al. | |
| 2002/0085428 A1* | 7/2002 | Kang et al. ............... | 365/189.08 |
| 2004/0174735 A1* | 9/2004 | Agata ........................ | 365/149 |
| 2008/0123457 A1* | 5/2008 | Lee ............................ | 365/226 |
| 2010/0008129 A1 | 1/2010 | Teramoto | |
| 2010/0195417 A1* | 8/2010 | Ogasawara et al. ...... | 365/189.11 |
| 2011/0044121 A1 | 2/2011 | Kim et al. | |
| 2013/0094307 A1* | 4/2013 | Cheng et al. ................ | 365/191 |

FOREIGN PATENT DOCUMENTS

KR    2009-0060620 A    6/2009

* cited by examiner

*Primary Examiner* — Toan Le
(74) *Attorney, Agent, or Firm* — Muir Patent Law, PLLC

(57) ABSTRACT

A semiconductor device may include a first memory cell connected to a bit-line and a first word-line, a second memory cell connected to a complementary bit-line and a second word-line, and an equalizer. The equalizer may be configured to transition a voltage of the bit-line and the complementary bit-line from a first voltage to a second voltage different from the first voltage at a first time period when the bit-line and complementary bit line are floating, and to transition the voltage of at least one of the bit-line and the complementary bit-line from the second voltage to a third voltage at a second time period after the first time period when the bit-line and complementary bit line are floating, the third voltage being different from the first and second voltages.

20 Claims, 13 Drawing Sheets

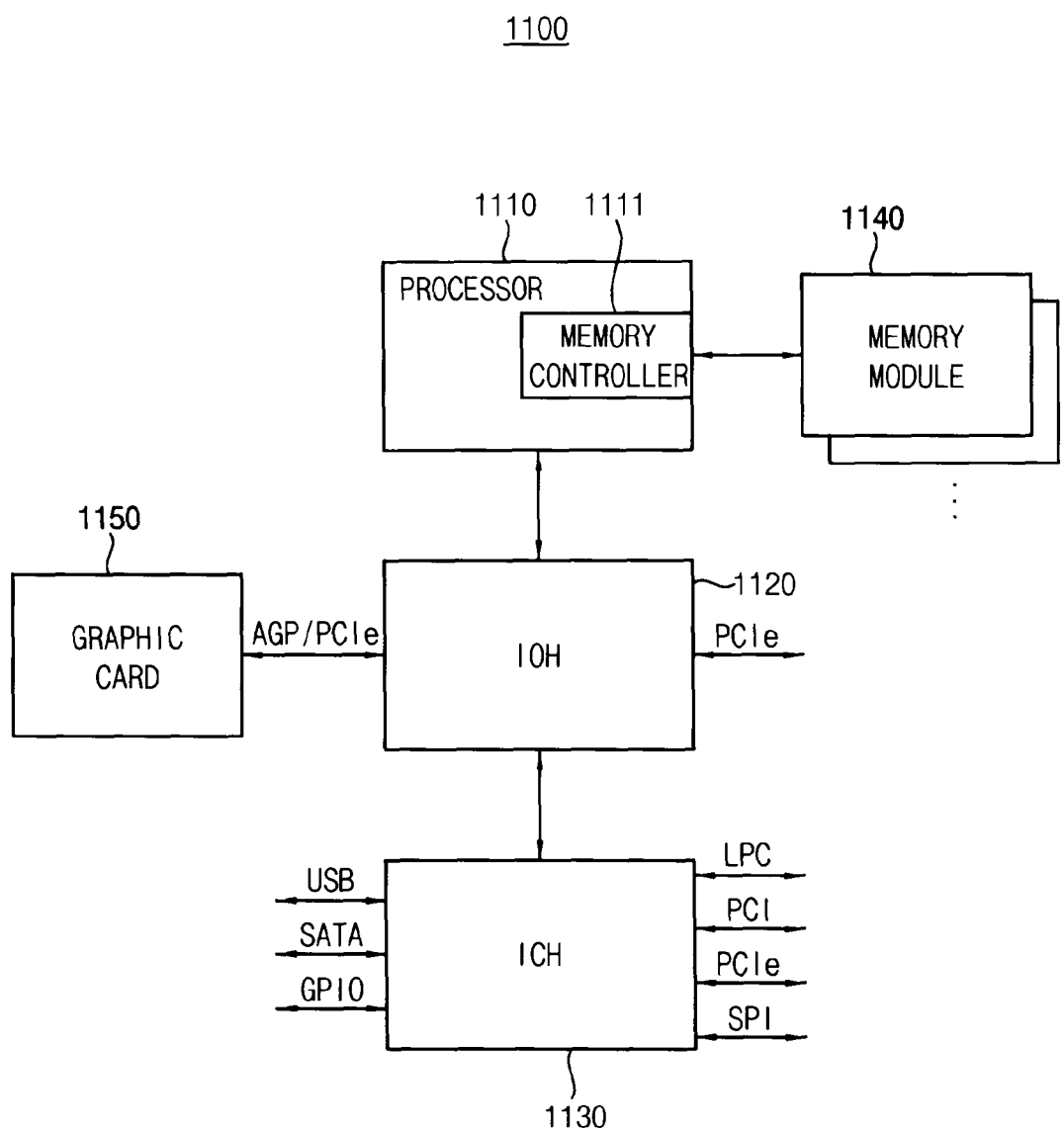

MEMORY CORE AND SEMICONDUCTOR MEMORY DEVICE INCLUDING THE SAME

CROSS-REFERENCE TO RELATED APPLICATION

This application claims priority under 35 USC §119 to Korean Patent Application No. 10-2013-0003190, filed on Jan. 11, 2013 in the Korean Intellectual Property Office (KIPO), the content of which is herein incorporated by reference in its entirety.

BACKGROUND

Example embodiments relate generally to a memory fields, and more particularly to a memory core and a semiconductor memory device including the same.

In general, a semiconductor memory device is a memory device to store data therein so that the data are read out therefrom if necessary. The semiconductor memory device may be classified into volatile memory devices and nonvolatile memory devices.

The volatile memory devices may lose stored data if power is shut off. The volatile memory devices may include a static RAM (SRAM), a dynamic RAM (DRAM), a synchronous DRAM (SDRAM), and the like. The nonvolatile memory devices may retain stored data even if power is shut off. The nonvolatile memory devices may include a PROM (Programmable ROM), an EPROM (Erasable PROM), an EEPROM (Electrically EPROM), and a flash memory device (flash memory device).

In the DRAM, a memory cell array may be connected to a bit-line BL and a complementary bit-line BLB. When a read operation is performed, a sense amplifier senses and amplifies the voltage difference between the bit line BL and the complementary bit-line BLB. However, the fineness of semiconductor processes and the reduction of a power voltage may make it more difficult to write data and to sense the write data.

SUMMARY

Some example embodiments provide a memory core capable of improving the operating characteristic thereof.

Some example embodiments provide a semiconductor memory device having the memory core.

According to some example embodiments, a semiconductor memory device includes first and second memory cells and an equalizer. The first memory cell is connected to a bit-line and a first word-line. The second memory cell is connected to a complementary bit-line and a second word-line. The equalizer is configured to transition a voltage of the bit-line and the complementary bit-line from a first voltage to a second voltage different from the first voltage at a first time period when the bit-line and complementary bit line are floating, and configured to transition the voltage of at least one of the bit-line and the complementary bit-line from the second voltage to a third voltage at a second time period after the first time period when the bit-line and complementary bit line are floating, the third voltage being different from the first and second voltages.

According to some example embodiments, a semiconductor memory device includes a memory core, a local sense amplifier, an input/output (I/O) sense amplifier and an I/O buffer. The memory core includes a first memory cell connected to a first bit-line and a first word-line, and a control signal generator. The memory core is configured to equalize voltage levels of the first bit-line and the second bit-line different from the first bit-line, to activate the first word-line, to amplify a voltage difference between the first bit-line and the second bit-line, and to provide the amplified voltage difference to a local I/O line pair. The local sense amplifier is configured to amplify a voltage signal of the local input/output line pair and provides the voltage signal to a global I/O line pair. The I/O sense amplifier amplifies a voltage signal of the global I/O line pair. The I/O buffer is configured to buffer and output an output signal of the I/O sense amplifier, or buffer input data. The control signal generator is configured to transition the equalized voltage level of the first and second bit-lines at least two times while the first and second bit-lines are floating.

According to some example embodiments, a method of operating a memory device having a plurality of memory cells connected to word-lines and bit-lines is provided. The method includes, causing a first bit-line and a second bit-line at a first time period to have a first voltage; at a second time period after the first time period, causing the first bit-line and the second bit line to transition from the first voltage to a second voltage different from the first voltage; at a third time period after the second time period, causing at least one of the first bit-line and the second bit line to transition from the second voltage to a third voltage different from the first and second voltages; and at a fourth time period after the third time period, causing one of the first and second bit-lines to share charge with a selected memory cell by selecting a corresponding word-line operatively connected to the selected memory cell.

BRIEF DESCRIPTION OF THE DRAWINGS

This disclosure will become apparent to those of ordinary skill in the art by describing in detail exemplary embodiments with reference to the attached drawings in which:

FIG. 14 is a block diagram illustrating a computing system according to example embodiments.

DETAILED DESCRIPTION OF THE EMBODIMENTS

Figure 1:
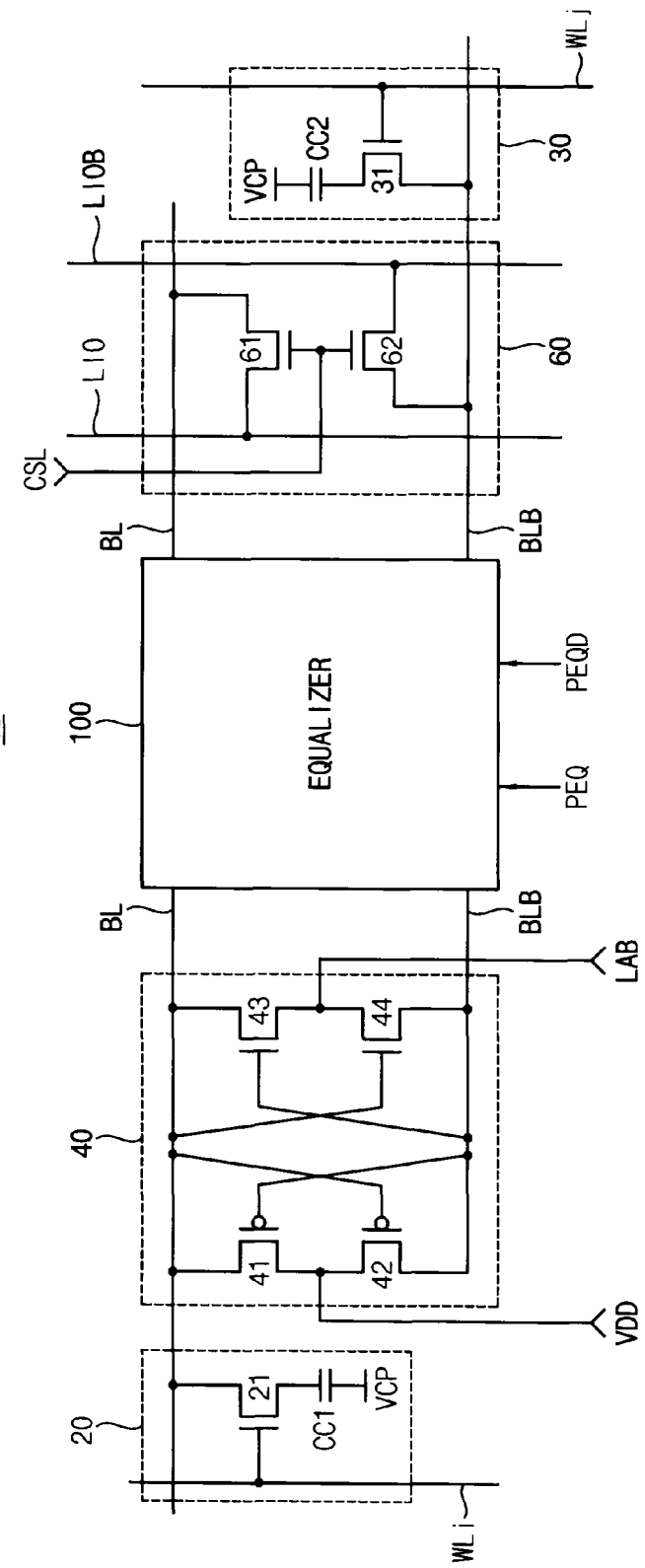
FIG. 1 is a circuit diagram illustrating the configuration of a memory core according to example embodiments.

Various example embodiments will be described more fully with reference to the accompanying drawings, in which embodiments are shown. This inventive concept may, however, be embodied in many different forms and should not be construed as limited to the embodiments set forth herein. Like reference numerals refer to like elements throughout this application.

It will be understood that, although the terms first, second, etc. may be used herein to describe various elements, these elements should not be limited by these terms. Unless indicated otherwise, these terms are used to distinguish one element from another. Thus, a first element could be termed a second element, and, similarly, a second element could be termed a first element, without departing from the scope of the disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, according to example embodiments will be described in detail with reference to accompanying drawings. The same reference numerals will be assigned to the same elements, and the details thereof will be omitted in order to avoid redundancy.

FIG. 1 is a circuit diagram illustrating the configuration of a memory core according to example embodiments.

Referring to FIG. 1, a memory device (not shown) may include a memory core 10. The memory core 10 may include at least one first memory cell 20, at least one second memory cell 30, a bit-line sense amplifier 40, a column select circuit 60, and an equalizer 100.

In FIG. 1, since a bit-line BL and a complementary bit-line BLB are provided in opposition to each other about the bit-line sense amplifier 40, the bit-line BL and the complementary bit-line BLB have open bit-line structures.

The first memory cell 20 is connected between a word-line WLi and a bit-line BL. The first memory cell 20 includes a first transistor 21 and a first cell capacitor CC1 which are connected to each other in series. The first transistor 21 has a first electrode connected to the bit-line BL and a gate connected to the word-line WLi. The first cell capacitor CC1 has a first terminal connected to a second electrode of the first transistor 21, and cell plate voltage VCP is applied to a second terminal of the first cell capacitor CC1. The second memory cell 30 is connected between a word-line WLj and a complementary bit-line BLB. The second memory cell 30 includes a first transistor 31 and a second cell capacitor CC2 which are connected to each other in series. The second transistor 31 has a first electrode connected to the complementary bit-line BLB and a gate connected to the word-line WLj. The second cell capacitor CC2 has a first terminal connected to a second electrode of the second transistor 31, and cell plate voltage VCP is applied to a second terminal of the second cell capacitor CC2.

The bit-line sense amplifier 40 may include PMOS transistors 41 and 42, and NMOS transistors 43 and 44. The PMOS transistors 41 are 42 sense the voltage difference between the bit-line BL and the complementary bit-line BLB, and amplify the voltage difference between the bit-line BL and the complementary bit-line BLB by using supply voltage VDD. The PMOS transistor 41 includes a source connected to the bit-line BL and a gate connected to the complementary bit-line BLB. The PMOS transistor 42 includes a source connected to a drain of the PMOS transistor 41, a gate connected to the bit-line BL, and a drain connected to the complementary bit-line BLB. The NMOS transistors 43 and 44 sense the voltage difference between the bit-line BL and the complementary bit-line BLB, and amplify the voltage difference between the bit-line BL and the complementary bit-line BLB in response to an amplification control signal LAB (e.g., VSS).

The column select circuit 60 may include NMOS transistors 61 and 62. The NMOS transistor 61 is connected to both the bit-line BL and the local input/output line LIO and has a gate to which a column select signal CSL is applied. The NMOS transistor 62 is connected to both of the complementary bit-line BLB and a complementary local input/output line LIOB, and has a gate to which the column select signal CSL is applied. The NMOS transistor 61 connects the bit-line BL with the local input/output line LIO in response to the column select signal CSL, and the NMOS transistor 62 connects the complementary bit-line BLB with the complementary local input/output line LIOB in response to the column select signal CSL.

The equalizer 100 is connected to both of the bit-line BL and the complementary bit-line BLB. The equalizer 100 may maintain the bit-line BL and the complementary bit-line BLB at the same potential in an equalization region, and may increase the voltage difference between the bit-line BL and the complementary bit-line BLB in a floating region in response to an equalization control signal PEQ and at least one dummy equalization control signal PEQD (a dummy equalization control signal is also referred to as a coupling control signal).

The states of the bit-line BL and the complementary bit-line BLB are in the floating region when no power (or ground) signal is applied to the bit-line BL and the complementary bit-line BLB. As such, the equalizer 100 may increase the voltage difference between the bit-line BL and the complementary bit-line BLB before the bit-line sense amplifier 40 performs a sensing operation. Accordingly, the bit-line sense amplifier 40 may perform a proper sensing operation since the decrease in the voltage difference between the bit-line BL and the complementary bit-line BLB, which is caused by the fineness of the semiconductor process or the reduction of a supply voltage, is compensated.

Figure 2:
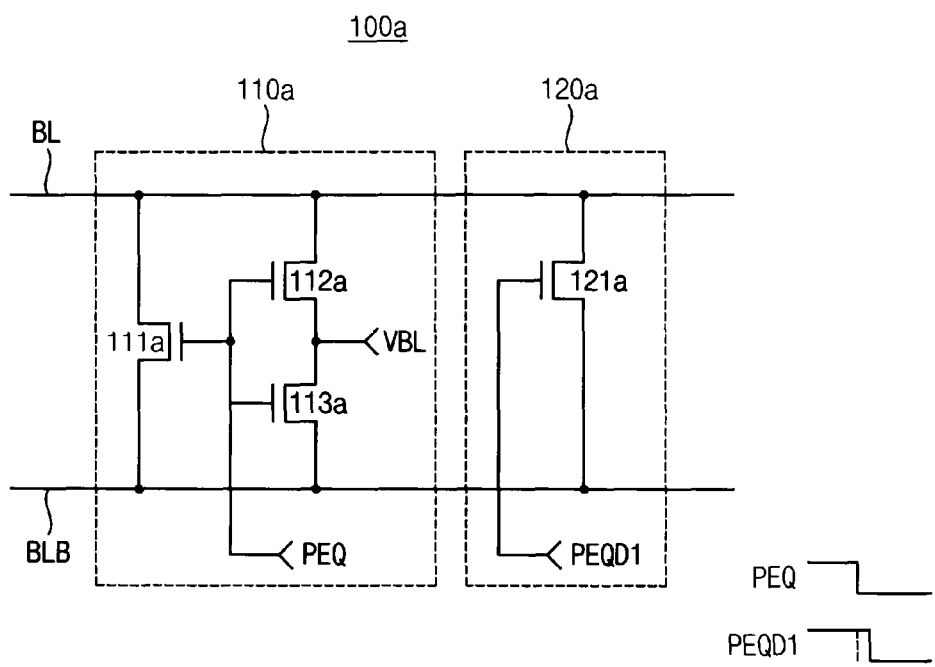
FIG. 2 is a circuit diagram illustrating the configuration of an equalizer of FIG. 1 according to one example embodiment.

FIG. 2 is a circuit diagram illustrating the configuration of an equalizer of FIG. 1 according to one example embodiment.

Referring to FIG. 1, an equalizer 100a may include a first equalizing circuit 110a and a coupling circuit 120a.

The first equalizing circuit 110a may include NMOS transistors 111a, 112a, and 113a. The NMOS transistor 111a is connected between a bit-line BL and a complementary bit-line BLB. The NMOS transistors 112a and 113a are connected to the NMOS transistor 111a in parallel in a cascade form between the bit-line BL and the complementary bit-line BLB. As such, the NMOS transistor 112a is connected between the bit-line BL and the NMOS transistor 113a, and the NMOS transistor 113a is connected between the NMOS transistor 112a and the complementary bit-line BLB. Bit-line pre-charge voltage VBL is applied to a source of the NMOS transistor 112a and a drain of the NMOS transistor 113a, which connect the NMOS transistors 112a and 113a to each other. An equalization control signal PEQ is applied to gates of the NMOS transistors 111a, 112a, and 113a. The coupling circuit 120a may include an NMOS transistor 121a. The NMOS transistor 121a is connected to the first equalizing circuit 110a in parallel between the bit-line BL and the complementary bit-line BLB. The NMOS transistor 121a has a gate to which a first dummy equalization control signal PEQD1 is applied. The first dummy equalization control signal PEQD1 is disabled with a delay with respect to the equalization control signal PEQ.

The first equalizing circuit 110a pre-charges the bit-line BL and the complementary bit-line BLB with the pre-charge voltage VBL and performs an equalization function to maintain the bit-line BL and the complementary bit-line BLB at the same potential in pre-charge and equalization regions in which the equalization control signal PEQ is enabled. In more detail, if the equalization control signal PEQ is enabled, The NMOS transistors 112a and 113a pre-charge the bit-line BL and the complementary bit-line BLB with the pre-charge voltage VBL, and the NMOS transistor 111a performs the equalization function to maintain the bit-line BL and the complementary bit-line BLB at the same potential by electrically connecting the bit-line BL with the complementary bit-line BLB. In the floating region in which the equalization control signal PEQ is disabled at a low level, even if the NMOS transistors 111a, 112a, and 113a are completely turned off, charges are transferred from the bit-line BL and the complementary bit-line BLB to the gates of the NMOS transistors 111a, 112a and 113a due to the parasitic capacitance existing among the gates of the NMOS transistors 111a, 112a and 113a, to which the equalization control signal PEQ is applied, the bit-line BL, and the complementary bit-line BLB. Accordingly, if the equalization control signal PEQ is disabled at a low level, the voltage of the bit-line BL and complementary bit-line BLB is reduced from the bit-line pre-charge voltage VBL to have a first level.

The coupling circuit 120a electrically connects the bit-line BL with the complementary bit-line BLB if the first dummy equalization control signal PEQD1 is enabled. Even if the first dummy equalization control signal PEQD1 is disabled with a delay with respect to the equalization control signal PEQ so that the NMOS transistor 121a is turned off, charges are transferred from the bit-line BL and the complementary bit-line BLB to the gate of the NMOS transistor 121a due to the parasitic capacitance existing among the gate of the NMOS transistor 121a, the bit-line BL, and the complementary bit-line BLB. Accordingly, if first dummy equalization control signal PEQD1 is disabled at the low level, the voltage of the bit-line BL and the complementary bit-line BLB is more reduced from the first level to have a second level.

As such, according to example embodiments, if the equalization control signal PEQ is disabled, the equalizer 100a lowers the voltage of the bit-line BL and the complementary bit-line BLB from the level of the bit-line pre-charge voltage VBL to the first level. In the floating region, in which if the first dummy equalization control signal PEQD1 is disabled, the equalizer 100a lowers the voltage of the bit-line BL and the complementary bit-line BLB from the first level to the second level.

Figure 3:
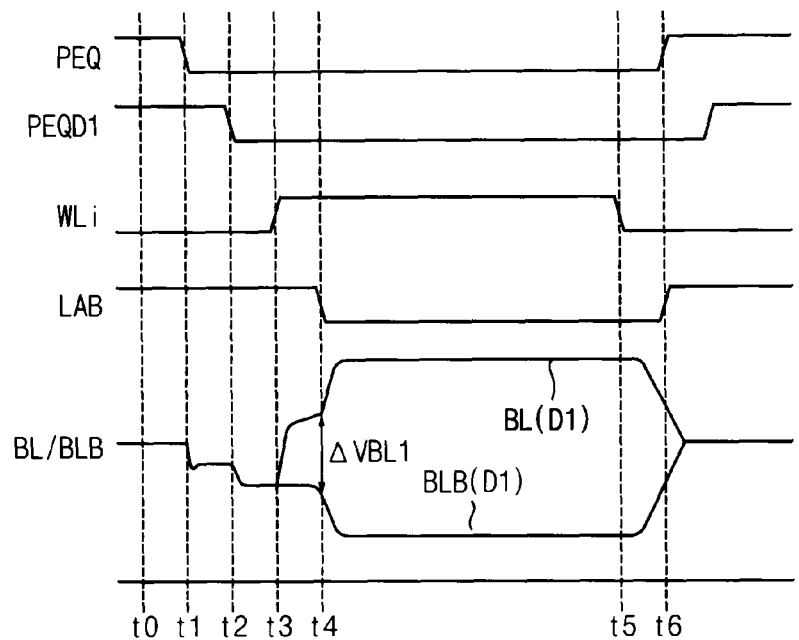
FIG. 3 is an exemplary timing diagram illustrating the operation of the memory core of FIG. 1 when the equalizer of FIG. 1 has the configuration of FIG. 2.

FIG. 3 is an exemplary timing diagram illustrating the operation of the memory core of FIG. 1 when the equalizer of FIG. 1 has the configuration of FIG. 2.

FIG. 3 illustrates the case that a high-level data D1 is stored in the first memory cell 20.

Referring to FIGS. 1 to 3, before time t0, the equalization control signal PEQ is enabled so that the bit-line BL and the complementary bit-line BLB are pre-charged with the bit-line pre-charge voltage VBL and equalized. At time t1, the equalization control signal PEQ is disabled, even if the NMOS transistors 111a, 112a, and 113a are completely turned off, charges are transferred from the bit-line BL and the complementary bit-line BLB to the gates of the NMOS transistors 111a, 112a and 113a due to the parasitic capacitance existing among the gates of the NMOS transistors 111a, 112a and 113a, to which the equalization control signal PEQ is applied, the bit-line BL, and the complementary bit-line BLB. Accordingly, if the equalization control signal PEQ is disabled at the low level, the voltage of the bit-line BL and complementary bit-line BLB is reduced from the bit-line pre-charge voltage VBL to have a first level. At time t2, even if the first dummy equalization control signal PEQD1 is disabled at the low level, so that the NMOS transistor 121a is turned off, charges are transferred from the bit-line BL and the complementary bit-line BLB to the gate of the NMOS transistor 121a due to the parasitic capacitance existing among the gate of the NMOS transistor 121a, the bit-line BL, and the complementary bit-line BLB. Accordingly, in the floating region, in which if first dummy equalization control signal PEQD1 is disabled at the low level, the voltage of the bit-line BL and the complementary bit-line BLB is more slightly reduced from the first level to have a second level.

At time t3, if the word-line WLi is enabled, charge sharing occurs between the cell capacitor CC1 and the bit-line BL. Accordingly, the voltage of the bit-line BL is increased from the second level, and the voltage of the complementary bit-line BLB is maintained at a present level (e.g., a second level). As such, from the time t3, the voltage of the bit-line BL makes a greater difference from the voltage of the complementary bit-line BLB. At time t4, if the amplification control signal LAB is enabled at the low level, the sense amplifier 40 performs a sensing operation, so that the voltage difference (ΔVBL1) between the bit-line BL and the complementary bit-line BLB is amplified. At the time t4, the voltage difference (ΔVBL1) between the bit-line BL and the complementary bit-line BLB is more increased due to the operation of the coupling circuit 120a as compared with the case that the coupling circuit 120a is not provided. Accordingly, the sense amplifier 40 may stably perform the sensing operation. At time t5, if the word-line WLi is disabled, the first memory cell 20 is disconnected from the bit-line BL. At time t6 and after the time t6, each of the equalization control signal PEQ and the first dummy equalization control signal PEQD1 are activated, so that the bit-line BL and the complementary bit-line BLB are pre-charged and equalized in preparation for a next read operation or a next write operation.

Figure 4:
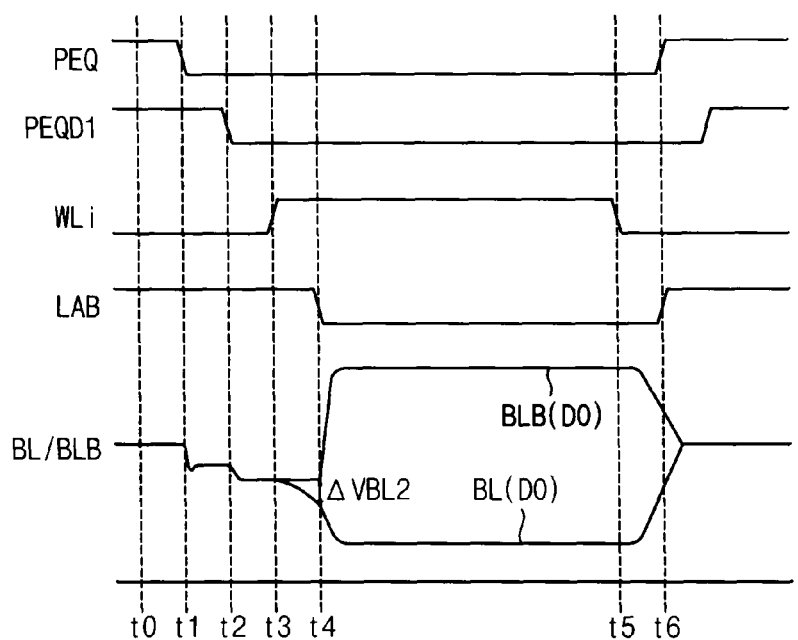
FIG. 4 is another exemplary timing diagram illustrating the operation of the memory core of FIG. 1 when the equalizer of FIG. 1 has the configuration of FIG. 2.

FIG. 4 is another exemplary timing diagram illustrating the operation of the memory core of FIG. 1 when the equalizer of FIG. 1 has the configuration of FIG. 2.

FIG. 4 illustrates that a low-level data D0 are stored in the first memory cell 20.

The operation of the memory core in the timing diagram of FIG. 4 makes a difference from the operation of the memory core in the timing diagram of FIG. 3 at times t3 to t6. Accordingly, the operation of the memory core will be described while focusing on the operations at the times t3 to t6.

Referring to FIGS. 1, 2, and 4, at time t3, if the word-line WLi is enabled, charge sharing occurs between the cell capacitor CC1 and the bit-line BL. Accordingly, the voltage of the bit-line BL is decreased from the second level, and the voltage of the complementary bit-line BL is maintained at a present level (e.g., a second level). As such, from the time t3, the voltage of the bit-line BL makes a greater difference from the voltage of the complementary bit-line BLB. At time t4, if the amplification control signal LAB is enabled at the low level, the sense amplifier 40 performs a sensing operation, so that the voltage difference (ΔVBL2) between the bit-line BL and the complementary bit-line BLB is amplified. After the time t4, the voltage difference (ΔVBL2) between the bit-line BL and the complementary bit-line BLB is more increased due to the sensing operation. Accordingly, the sense amplifier 40 may stably perform the sensing operation. At time t5, if the word-line WLi is disabled, the first memory cell 20 is disconnected from the bit-line BL. At time t6 and after the time t6, each of the equalization control signal PEQ and the first dummy equalization control signal PEQD1 are activated, so that the bit-line BL and the complementary bit-line BLB are pre-charged and equalized in preparation for a next read operation or a next write operation.

Figure 5:
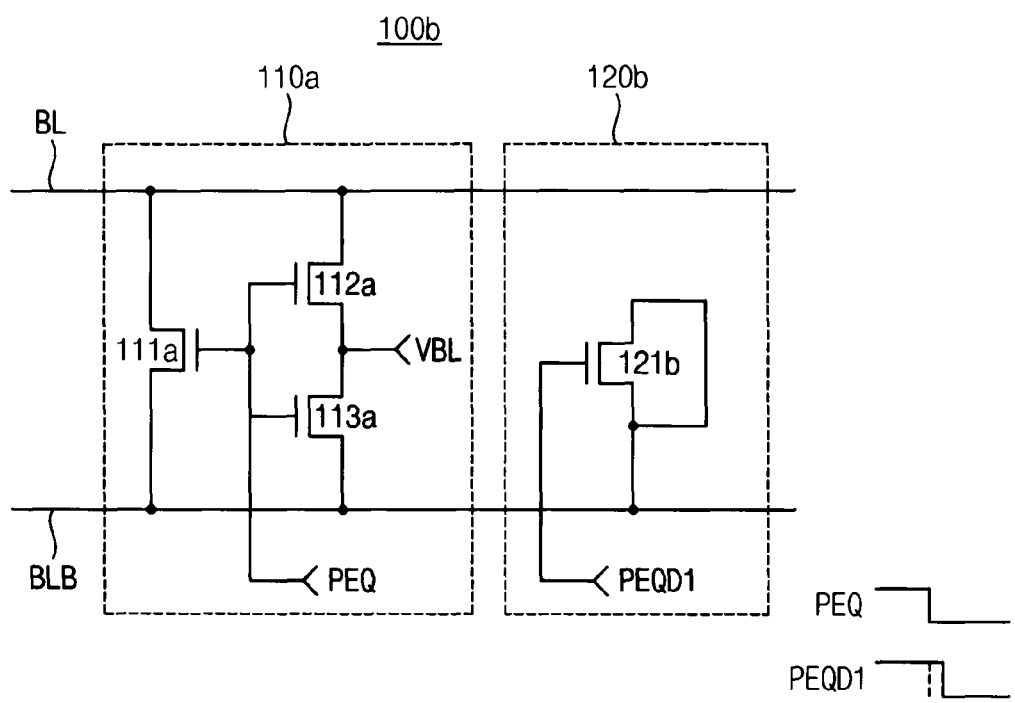
FIG. 5 is a circuit diagram illustrating one example the configuration of the equalizer according to another exempla embodiment.

FIG. 5 is a circuit diagram illustrating one example the configuration of the equalizer according to another example embodiment.

Referring to FIG. 5, an equalizer 100b may include a first equalizing circuit 110a and a coupling circuit 120b. Since the configuration of the first equalizing circuit 110a is identical to that of FIG. 2, the details of the configuration and the operation of the first equalizing circuit 110a will be omitted. The first equalizing circuit 110a pre-charges the bit-line BL and the complementary bit-line BLB with bit-line pre-charge voltage VBL and performs an equalization function to maintain the bit-line BL and the complementary bit-line BLB at the same potential in pre-charge and equalization regions in which the equalization control signal PEQ is enabled. In the floating region in which the equalization control signal PEQ is disabled at a low level, even if the NMOS transistors 111a, 112a, and 113a are completely turned off, charges are transferred from the bit-line BL and the complementary bit-line BLB to the gates of the NMOS transistors 111a, 112a and 113a due to the parasitic capacitance existing among the gates of the NMOS transistors 111a, 112a and 113a, to which the equalization control signal PEQ is applied, the bit-line BL, and the complementary bit-line BLB. Accordingly, if the equalization control signal PEQ is disabled at the low level, the voltage of the bit-line BL and complementary bit-line BLB is reduced from the bit-line pre-charge voltage VBL to have a first level.

The coupling circuit 120b may include an NMOS transistor 121b. The NMOS transistor 121b has a source connected to the complementary bit-line BLB and a drain connected to the complementary bit-line BLB, and a gate to which a first dummy equalization control signal PEQD1 is applied. Accordingly, the NMOS transistor 121b may serve as an MOS capacitor. The first dummy equalization control signal PEQD1 may be disabled with a delay with respect to the equalization control signal PEQ.

In the floating region, if the first dummy equalization control signal PEQD1 is disabled with a delay with respect to the equalization control signal PEQ, charges are transferred to an NMOS capacitor 121b from the complementary bit-line BLB. As such, if the first dummy equalization control signal PEQD1 is disabled, the NMOS capacitor 121b serves as a negative boosting capacitor to more reduce a voltage level of the complementary bit-line BLB. As such, the NMOS capacitor 121b operates as a complementary bit-line boosting capacitor. Accordingly, if the first dummy equalization control signal PEQD1 is disabled at the low level, the voltage of the complementary bit-line BLB is more reduced from the first level to have a second level, and the voltage of the bit-line BL may be maintained at the first level.

As such, according to another example embodiment, if the equalization control signal PEQ is disabled, a state of the bit-line BL and the complementary bit-line BLB will be in the floating region. The equalizer 100b lowers the voltage of the bit-line BL and the complementary bit-line BLB from the level of the bit-line pre-charge voltage VBL to the first level, and if the first dummy equalization control signal PEQD1 is disabled, the equalizer 100b operates as a negative boosting capacitor to lower the voltage of the complementary bit-line BLB from the first level to the second level.

Figure 6:
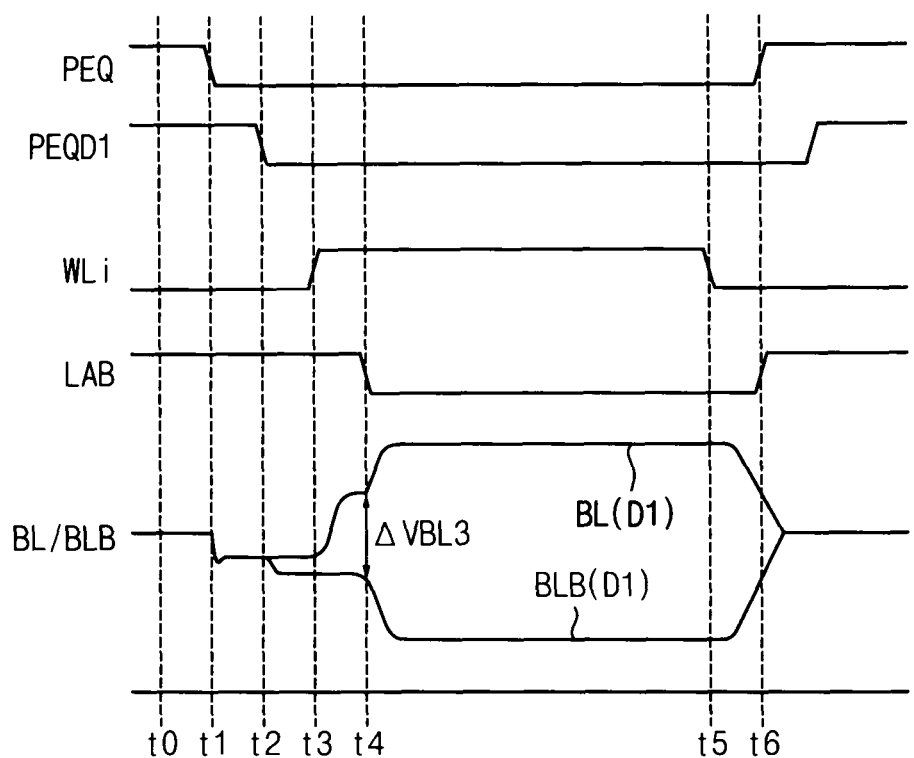
FIG. 6 is an exemplary timing diagram illustrating the operation of the memory core of FIG. 1 when the equalizer of FIG. 1 has the configuration of FIG. 5.

FIG. 6 is an exemplary timing diagram illustrating the operation of the memory core of FIG. 1 when the equalizer of FIG. 1 has the configuration of FIG. 5.

FIG. 6 illustrates that a high-level data D1 are stored in a first memory cell 20.

Referring to FIGS. 1, 5, and 6, before time t0 the equalization control signal PEQ is enabled so that the bit-line BL and the complementary bit-line BLB are pre-charged with the bit-line pre-charge voltage VBL and equalized. At time t1, in the floating region that the equalization control signal PEQ is disabled, even if the NMOS transistors 111a, 112a, and 113a are completely turned off, charges are transferred from the bit-line BL and the complementary bit-line BLB to the gates of the NMOS transistors 111a, 112a and 113a due to the parasitic capacitance existing among the gates of the NMOS transistors 111a, 112a and 113a, to which the equalization control signal PEQ is applied, the bit-line BL, and the complementary bit-line BLB. Accordingly, if the equalization control signal PEQ is disabled at the low level, the voltage of the bit-line BL and complementary bit-line BLB is reduced from the bit-line pre-charge voltage VBL to have the first level. At time t2, if the first dummy equalization control signal PEQD1 is disabled at the low level, charges are transferred from the complementary bit-line BLB to the NMOS capacitor 121b. As such, in the floating region, if the first dummy equalization control signal PEQD1 is disabled, the NMOS capacitor 121b operates as the negative boosting capacitor to more lower the voltage of the complementary bit-line BLB.

At time t3, if the word-line WLi is enabled, charge sharing occurs between the cell capacitor CC1 and the bit-line BL.

Accordingly, the voltage of the bit-line BL is increased from the first level, and the voltage of the complementary bit-line BL is maintained at the second level. At time t4, if the amplification control signal LAB is enabled at the low level, the sense amplifier 40 performs a sensing operation, so that the voltage difference (ΔVBL3) between the bit-line BL and the complementary bit-line BLB is amplified. At the time t4, the voltage difference (ΔVBL3) between the bit-line BL and the complementary bit-line BLB is more increased due to the negative boosting operation of the coupling circuit 120b as compared with the case that the coupling circuit 120b is not provided. Accordingly, the sense amplifier 40 may stably perform the sensing operation. At time t5, if the word-line WLi is disabled, the first memory cell 20 is disconnected from the bit-line BL. At time t6 and after the time t6, each of the equalization control signal PEQ and the first dummy equalization control signal PEQD1 are activated, so that the bit-line BL and the complementary bit-line BLB are pre-charged and equalized in preparation for a next read operation or a next write operation.

Figure 7:
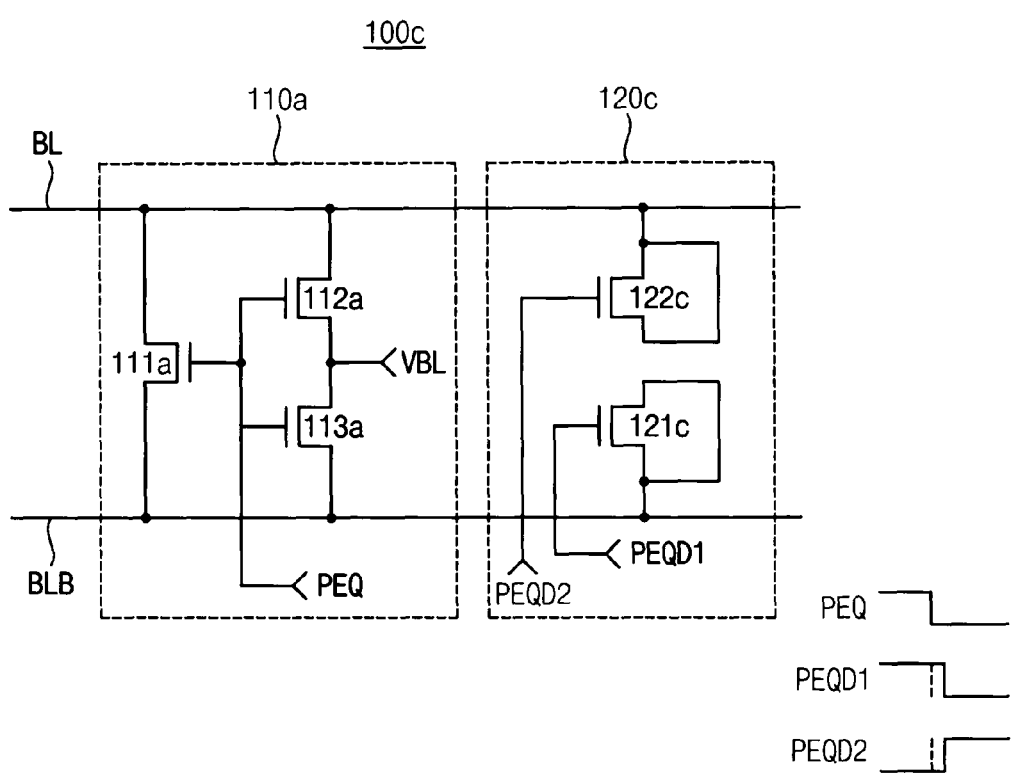
FIG. 7 is a circuit diagram illustrating the configuration of the equalizer of FIG. 1 according to another example embodiment.

FIG. 7 is a circuit diagram illustrating the configuration of the equalizer of FIG. 1 according to another example embodiment.

Referring to FIG. 7, an equalizer 100c may include a first equalizing circuit 110a and a coupling circuit 120c. Since the configuration of the first equalizing circuit 110a is identical to that of FIG. 2, the details of the configuration and the operation of the first equalizing circuit 110a will be omitted. In pre-charge and equalization regions in which the equalization control signal PEQ is enabled, the first equalizing circuit 110a pre-charges the bit-line BL and the complementary bit-line BLB with bit-line pre-charge voltage VBL and performs an equalization function to maintain the bit-line BL and the complementary bit-line BLB at the same potential. In the floating region in which the equalization control signal PEQ is disabled at the low level, even if the NMOS transistors 111a, 112a, and 113a are completely turned off, charges are transferred from the bit-line BL and the complementary bit-line BLB to the gates of the NMOS transistors 111a, 112a and 113a due to the parasitic capacitance existing among the gates of the NMOS transistors 111a, 112a and 113a, to which the equalization control signal PEQ is applied, the bit-line BL, and the complementary bit-line BLB. Accordingly, if the equalization control signal PEQ is disabled at the low level, the voltage of the bit-line BL and complementary bit-line BLB is slightly reduced from the bit-line pre-charge voltage VBL to have a first level.

The coupling circuit 120c may include NMOS transistors 121c and 122c. The NMOS transistor 121c has a source connected to the complementary bit-line BLB and a drain connected to the complementary bit-line BLB, and a gate to which a first dummy equalization control signal PEQD1 is applied. The NMOS transistor 122c has a source connected to the bit-line BL and a drain connected to the bit-line BL, and a gate to which a second dummy equalization control signal PEQD2 is applied. Accordingly, the NMOS transistors 121c and 122c may serve as MOS capacitors. The first dummy equalization control signal PEQD1 is disabled with a delay with respect to the equalization control signal PEQ, and the second dummy equalization control signal PEQD2 has a phase inverse to that of the first dummy equalization control signal PEQD1. In the floating region, if the first dummy equalization control signal PEQD1 is disabled, charges are transferred to an NMOS capacitor 121c from the complementary bit-line BLB. Accordingly, the NMOS transistor 121c of the coupling circuit 120c serves as a negative boosting capacitor to lower the voltage level of the complementary bit-line BLB if the first dummy equalization control signal PEQD1 is disabled. As such, in the floating region, if the first dummy equalization control signal PEQD1 is disabled with a delay with respect to the equalization control signal PEQ, the NMOS transistor 121c serves as a negative boosting capacitor of the complementary bit-line BLB to lower the voltage of the complementary bit-line BLB from the first level to a second level.

The second dummy equalization control signal PEQD2 has a phase inverse to that of the first dummy equalization control signal PEQD1. Accordingly, if the equalization control signal PEQ is enabled, the second dummy equalization control signal PEQD2 is disabled, so that the charges of the bit-line BL are stored in the NMOS transistor 122c. In the floating region, if the second dummy equalization control signal PEQD2 is activated, the charges stored in the NMOS transistor 122c are transferred to the bit-line BL, so that the voltage of the bit-line BL is increased from the first level to a third level. In the floating region, if the second dummy equalization control signal PEQD2 is disabled with a delay with respect to the equalization control signal PEQ, inverted, and enabled, the NMOS transistor 122c operates as the positive boosting capacitor of the bit-line BLB to increase the voltage of the bit-line BL from the first level to the third level. As such, according to example embodiments of FIG. 7, the NMOS transistors 121c and 122c of the coupling circuit 120c operate as boosting capacitors to the complementary bit-line BLB and the bit-line BL, respectively, so that the voltage difference between the complementary bit-line BLB and the bit-line BL are more increased.

Figure 8:
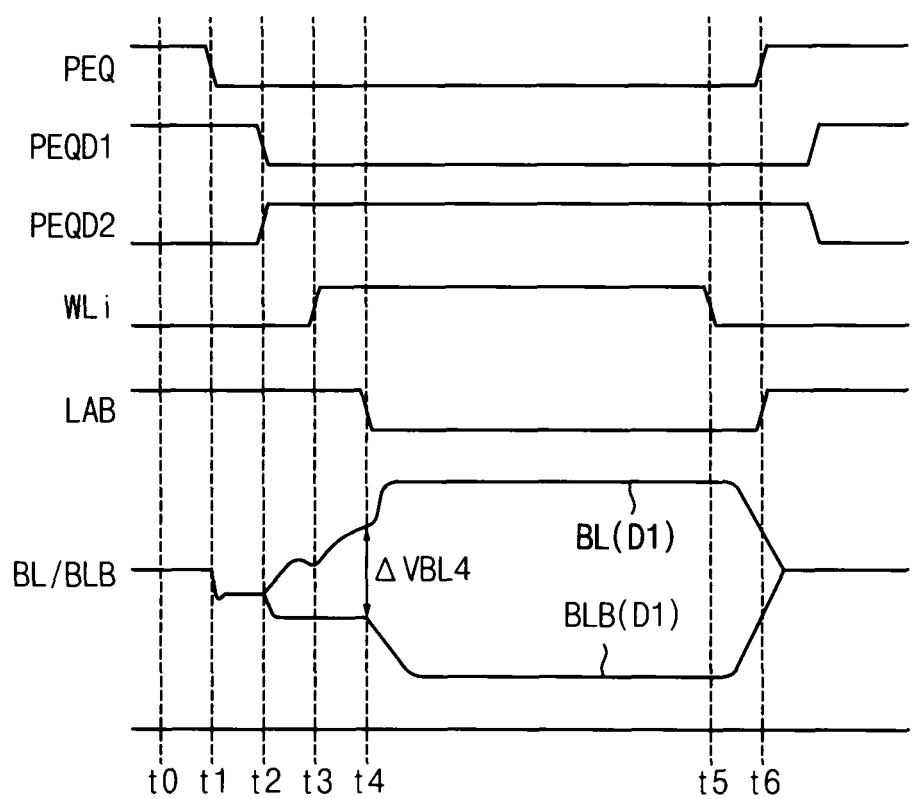
FIG. 8 is an exemplary timing diagram illustrating the operation of the memory core of FIG. 1 when the equalizer of FIG. 1 has the configuration of FIG. 7.

FIG. 8 is an exemplary timing diagram illustrating the operation of the memory core of FIG. 1 when the equalizer of FIG. 1 has the configuration of FIG. 7.

FIG. 8 illustrates the case that a high-level data D1 is stored in the first memory cell 20.

Referring to FIGS. 1, 7, and 8, before time t0, the equalization control signal PEQ is enabled so that the bit-line BL and the complementary bit-line BLB are pre-charged with the bit-line pre-charge voltage VBL and equalized. At time t1, in the floating region that the equalization control signal PEQ is disabled, even if the NMOS transistors 111a, 112a, and 113a are completely turned off, charges are transferred from the bit-line BL and the complementary bit-line BLB to the gates of the NMOS transistors 111a, 112a and 113a due to the parasitic capacitance existing among the gates of the NMOS transistors 111a, 112a and 113a, to which the equalization control signal PEQ is applied, the bit-line BL, and the complementary bit-line BLB. Accordingly, if the equalization control signal PEQ is disabled at a low level, the voltage of the bit-line BL and complementary bit-line BLB is slightly reduced from the bit-line pre-charge voltage VBL to have a first level. At time t2, if the first dummy equalization control signal PEQD1 is disabled at the low level, charges are transferred from the complementary bit-line BLB to the NMOS capacitor 121c. As such, in the floating region, if the first dummy equalization control signal PEQD1 is disabled, the NMOS capacitor 121c operates as the negative boosting capacitor to more lower the voltage of the complementary bit-line BLB, so that the voltage of the bit-line BLB is more lowered from the first level to the second level. In addition, at time t2, if the second dummy equalization control signal PEQD2 is enabled, charges are transferred from the NMOS capacitor 122c to the bit-line BL, so that the voltage of the bit-line BL is increased from the first level to the third level. As such, the NMOS transistor 122c operates as a positive boosting capacitor to increase the voltage of the bit-line BL.

As such, from the time t2, the voltage of the bit line BL makes a greater difference from that of the complementary bit-line BLB.

At time t3, if the word-line WLi is enabled, charge sharing occurs between the cell capacitor CC1 and the bit-line BL. Accordingly, the voltage of the bit-line BL is increased from the third level to the fourth level, and the voltage of the complementary bit-line BL is maintained at a present level. At time t4, if the amplification control signal LAB is enabled at the low level, the sense amplifier 40 performs a sensing operation, so that the voltage difference ($\Delta$VBL4) between the bit-line BL and the complementary bit-line BLB is amplified. At the time t4, the voltage difference ($\Delta$VBL4) between the bit-line BL and the complementary bit-line BLB is more increased due to the operation of thecoupling circuit 120c as compared with the case that the coupling circuit 120c is not provided. Accordingly, the sense amplifier 40 may stably perform the sensing operation. At time t5, if the word-line WLi is disabled, the first memory cell 20 is disconnected from the bit-line BL. At time t6 and after the time t6, each of the equalization control signal PEQ and the first dummy equalization control signal PEQD1 are activated and the second dummy equalization control signal PEQD2 is disabled, so that the bit-line BL and the complementary bit-line BLB are pre-charged and equalized in preparation for a next read operation or a next write operation.

Therefore, according to example embodiments, before the charge sharing occurs due to the operation of the coupling circuits 120a, 120b, or 120c in the floating region, the equalizers 100a, 100b, or 100c more lower the voltage of the bit-line BL and the complementary bit-line BLB from the bit-line pre-charge voltage VBL, or performs a boosting operation with respect to the bit-line BL or the complementary bit-line BLB, so that the voltage difference between the bit-line BL and the complementary bit-line BLB may be more increased. Accordingly, the bit-line sense amplifier 40 may more stably perform the sensing operation.

Figure 9:
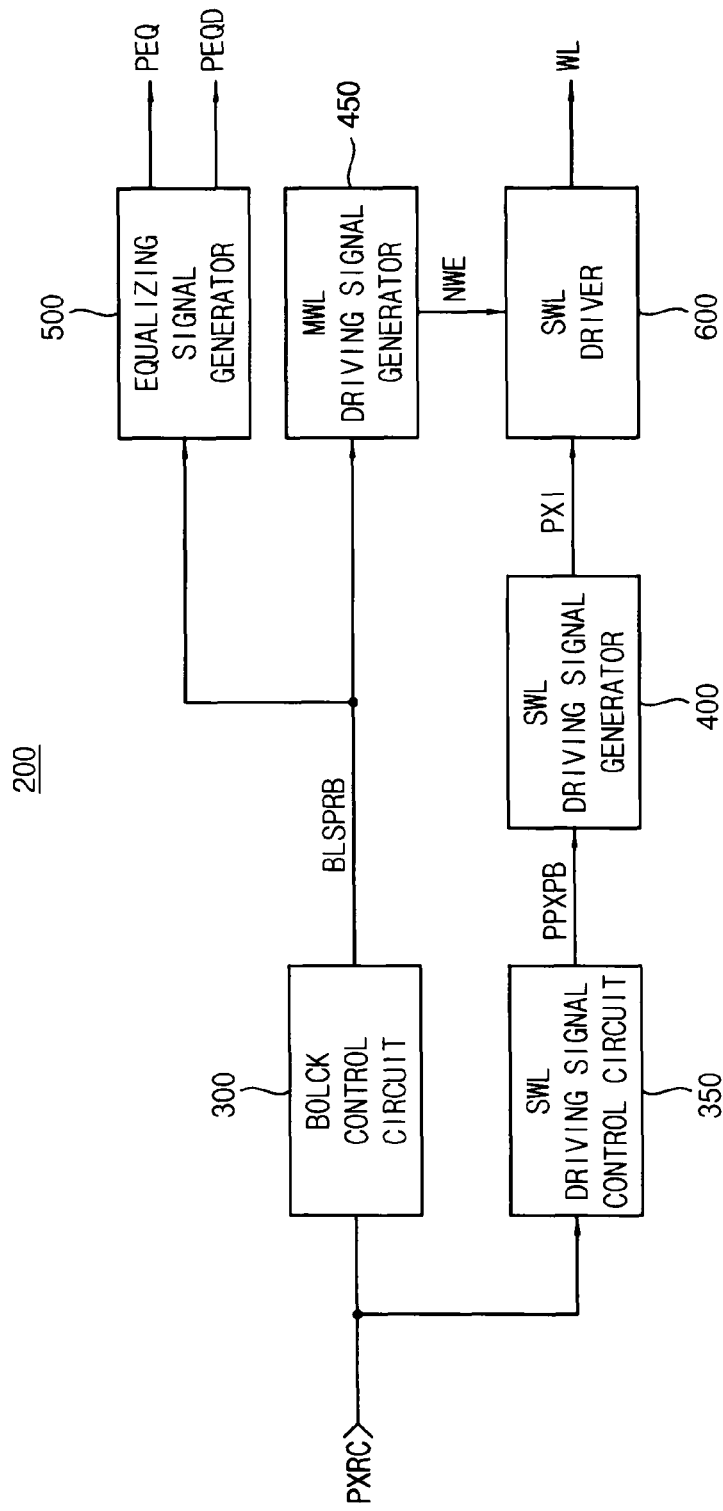
FIG. 9 is a block diagram illustrating the configuration of a control signal generator according to example embodiments.

FIG. 9 is a block diagram illustrating the configuration of a control signal generator according to example embodiments.

Referring to FIG. 9, a control signal generator 200 includes a block control circuit 300, a sub-word-line driving signal control circuit 350, a sub-word-line driving signal generator 400, an equalizing signal generator 500, a main word-line driving signal generator 450, and a sub-word-line driver 600. The control signal generator 200 may be included in the memory core 10 of FIG. 1.

The block control circuit 300 generates a block information pre-charge signal BLSPRB based on a pre-charge master signal PXRC. The sub-word-line driving signal control circuit 350 generates a first signal PPXPB to disable a sub-word-line driving signal PXI based on the pre-charge master signal PXRC. The sub-word-line driving signal generator 400 generates the sub-word-line driving signal PXI based on the first signal PPXPB. The equalizing signal generator 500 generates a bit-line equalization signal PEQ in response to the pulse back edge of the block information pre-charge signal BLSPRB. The main word-line driving signal generator 450 generates a main word-line driving signal NWE in response to the pulse-front edge of the block information pre-charge signal BLSPRB. The sub-word-line driver 600 generates a word-line driving signal WL based on the sub-word-line driving signal PXI and the main word-line driving signal NWE.

Figure 10:
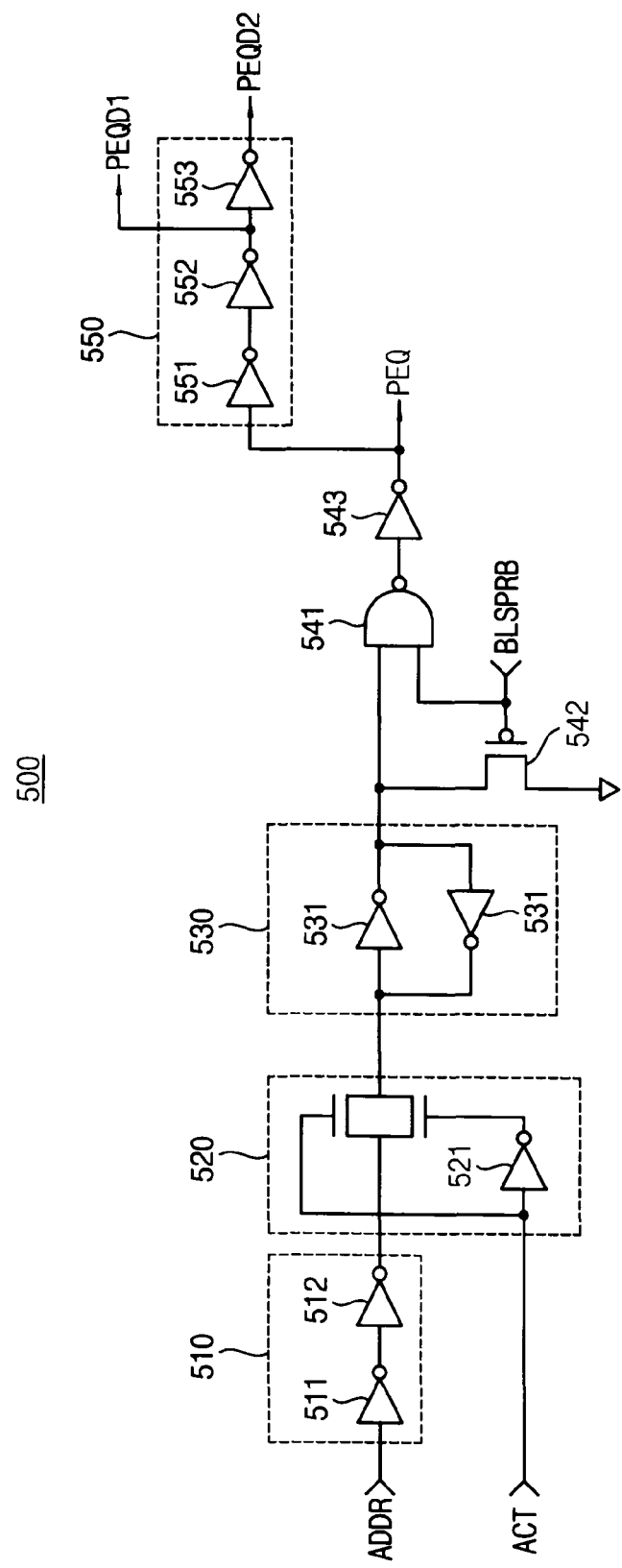
FIG. 10 is a circuit diagram illustrating the configuration of an equalization control signal generator of FIG. 9 according to example embodiments.

FIG. 10 is a circuit diagram illustrating the configuration of an equalizing signal generator of FIG. 9 according to example embodiments.

Referring to FIG. 10, the equalizing signal generator 500 includes a buffer 510, a switch 520, a latch circuit 530, an NMOS transistor 542, an NAND gate 541, an inverter 543, and a dummy equalization signal generator 550.

The buffer 510 buffers an address signal ADDR, and the switch 520 performs a switching operation and outputs an output signal of the buffer 510 in response to an active signal ACT. The latch circuit 530 latches the output signal of the switch 520. The NMOS transistor 542 pulls-down an output node of the latch circuit 530 in response to the block information pre-charge signal BLSPRB. The NAND gate 541 performs a NAND operation with respect to the block information pre-charge signal BLSPRB and an output signal of the latch circuit 530. The inverter 543 inverts an output signal of the NAND gate 541 to output an equalization control signal PEQ. The dummy equalization signal generator 550 includes a plurality of inverts 551 to 553 to delay the equalization control signal PEQ, thereby outputting the first and second dummy equalization control signals (or first and second coupling control signals) PEQD1 and PEQD2.

The buffer 510 includes inverters 511 and 512, and the switch 520 includes a transmission gate 522 and an inverter 521. The latch circuit 530 includes inverters 531 and 532.

Accordingly, the first dummy equalization control signal PEQD1 is delayed when comparing with the equalization control signal PEQ, and the second dummy equalization control signal PEQD2 has a phase inverse to that of the first dummy equalization control signal PEQD1.

Figure 11:
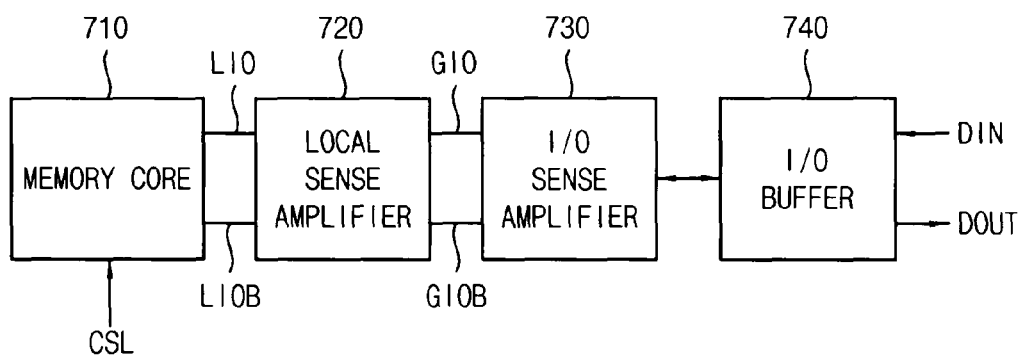
FIG. 11 is a block diagram illustrating the configuration of a semiconductor memory device according to example embodiments.

FIG. 11 is a block diagram illustrating the configuration of a semiconductor memory device according to example embodiments.

Referring to FIG. 11, the semiconductor memory device 700 includes a memory core 710, a local sense amplifier 720, an input/output sense amplifier 730, and an input/output buffer 740.

The memory core 710 pre-charges and equalizes the bit-line BL and the complementary bit-line VBL with bit-line pre-charge voltage VBL, activates one of word-lines, amplifies the voltage difference between the bit-line BL and the complementary bit-line VBL, and provides the amplified voltage difference to a local input/output line pair LIO and LIOB. The memory core 710 includes the memory core 10 of FIG. 1 to have the open bit-line structure, and more lowers the voltage of the bit-line BL and the complementary bit-line BLB, or performs a boosting operation with respect to the bit-line BL or the complementary bit-line BLB before a charge sharing operation, so that the voltage difference between the bit-line BL and the complementary bit-line BLB may be more increased. Accordingly, the bit-line sense amplifier may more stably perform the sensing operation. The local sense amplifier 720 amplifies the voltage signal of the local input/output line pair LIO and LIOB and provides the voltage signal to a global input/output line pair GIO and GIOB. The input/output sense amplifier 730 amplifies the global input/output line pair GIO or GIOB. The input/output buffer 740 buffers and outputs the output of the input/output sense amplifier 730, or buffers input data DIN. The output of the input/output buffer 740 is provided to the outside of the semiconductor memory device through an output pad (not shown).

Figure 12:
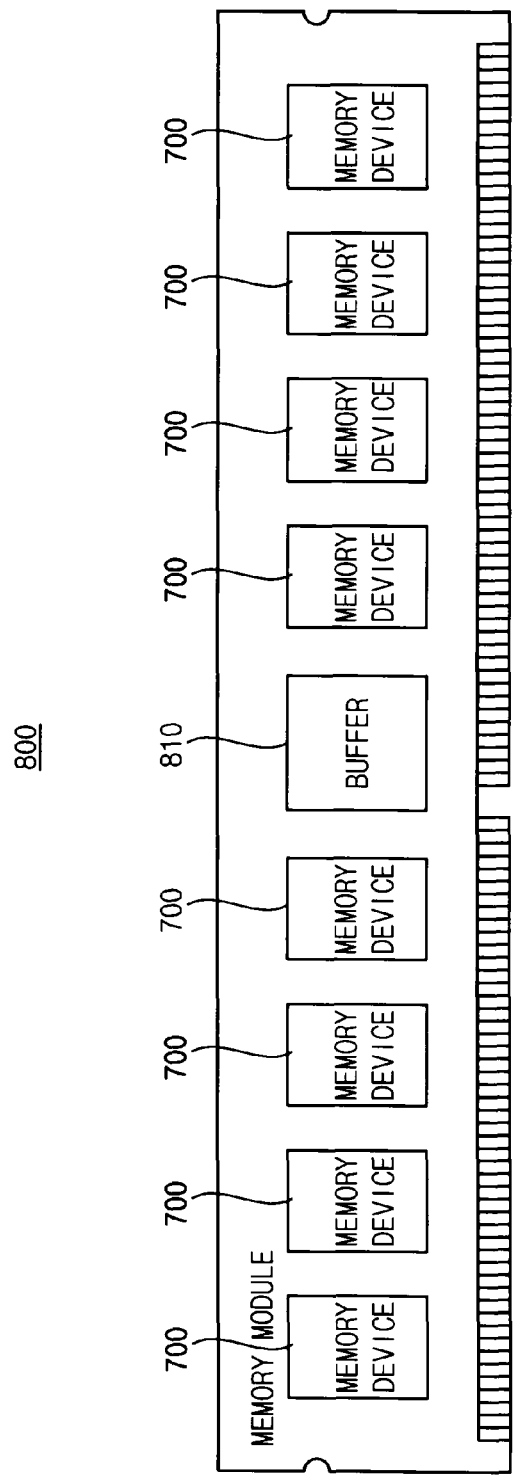
FIG. 12 is a block diagram illustrating a memory module according to example embodiments.

FIG. 12 is a block diagram illustrating a memory module according to example embodiments.

Referring to FIG. 12, a memory module 800 may include a plurality of semiconductor memory devices 700. In some embodiments, the memory module 800 may be an unbuffered dual in-line memory module (UDIMM), a registered dual in-line memory module (RDIMM), a fully buffered dual in-line memory module (FBDIMM), a load reduced dual in-line memory module LRDIMM, etc.

The memory module 800 may include a buffer 810 that provides a command/address signal and data by buffering the command/address signal and the data from a memory controller through a plurality of transmission lines. In some embodiments, data transmission lines between the buffer 810 and the semiconductor memory devices 700 may be coupled in a point-to-point topology, and command/address transmission lines between the buffer 810 and the semiconductor memory devices 700 may be coupled in a multi-drop topology, a daisy-chain topology, a fly-by daisy-chain topology, or the like. Since the buffer 810 buffers both the command/address signal and the data, the memory controller may interface with the memory module 800 by driving only a load of the buffer 810. Accordingly, the memory module 800 may include more memory devices and/or more memory ranks, and a memory system may include more memory modules.

Each of the semiconductor memory devices 700 may include the memory core 10 of FIG. 1 to have the open bit-line structure, and more lowers the voltage of the bit-line BL and the complementary bit-line BLB, or performs a boosting operation with respect to the bit-line BL or the complementary bit-line BLB before charge sharing, so that the voltage difference between the bit-line BL and the complementary bit-line BLB may be more increased. Accordingly, the bit-line sense amplifier may more stably perform the sensing operation.

Figure 13:
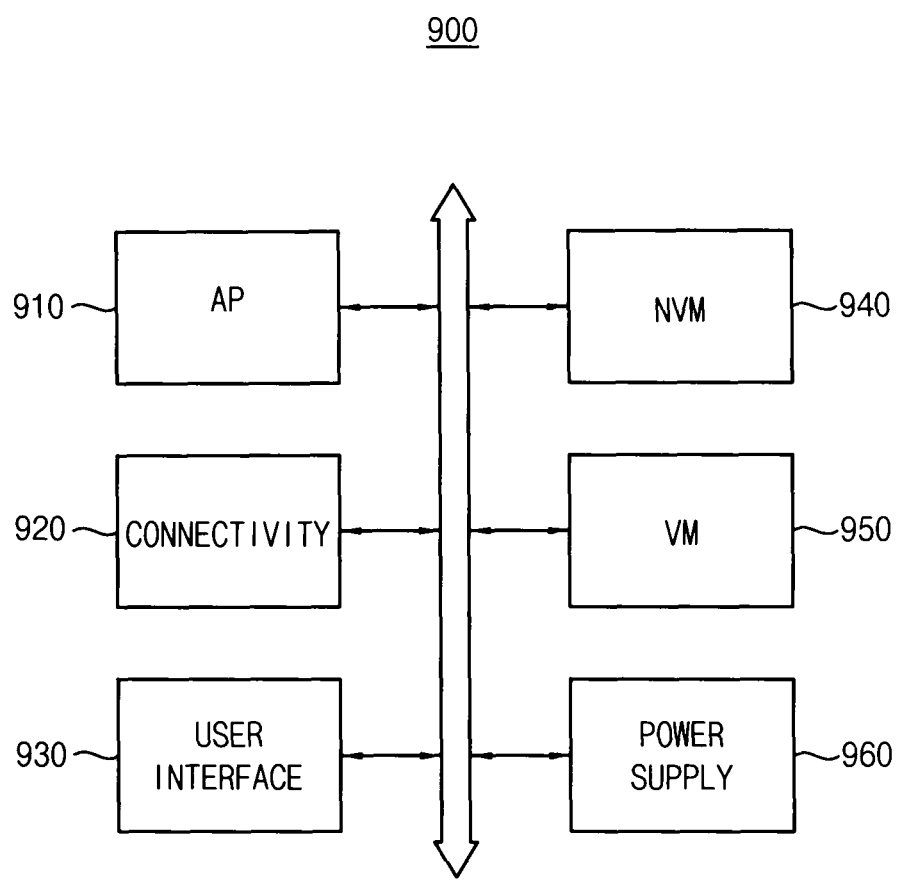
FIG. 13 is a block diagram illustrating a mobile system according to example embodiments.

FIG. 13 is a block diagram illustrating a mobile system according to example embodiments.

Referring to FIG. 13, a mobile system 900 includes an application processor 910, a connectivity unit 920, a volatile memory device 950, a nonvolatile memory device 940, a user interface 930 and a power supply 960. In some embodiments, the mobile system 900 may be a mobile phone, a smart phone, a personal digital assistant (PDA), a portable multimedia player (PMP), a digital camera, a music player, a portable game console, a navigation system, etc.

The application processor 910 may execute applications, such as a web browser, a game application, a video player, etc. In some embodiments, the application processor 910 may include a single core or multiple cores. For example, the application processor 910 may be a multi-core processor, such as a dual-core processor, a quad-core processor, a hexa-core processor, etc. The application processor 910 may include an internal or external cache memory.

The connectivity unit 920 may perform wired or wireless communication with an external device. For example, the connectivity unit 920 may perform Ethernet communication, near field communication (NFC), radio frequency identification (RFID) communication, mobile telecommunication, memory card communication, universal serial bus (USB) communication, etc. In some embodiments, connectivity unit 920 may include a baseband chipset that supports communications, such as global system for mobile communications (GSM), general packet radio service (GPRS), wideband code division multiple access (WCDMA), high speed downlink/uplink packet access (HSxPA), etc.

The volatile memory device 950 may store data processed by the application processor 910, or may operate as a working memory. For example, the volatile memory device 950 may be a dynamic random access memory, such as DDR SDRAM, LPDDR SDRAM, GDDR SDRAM, RDRAM, etc., or may be any volatile memory device that requires a refresh operation. The volatile memory device 950 may include the memory core 10 of FIG. 1 to have the open bit-line structure, and more lowers the voltage of the bit-line BL and the complementary bit-line BLB, or performs a boosting operation with respect to the bit-line BL or the complementary bit-line BLB before charge sharing, so that the voltage difference between the bit-line BL and the complementary bit-line BLB may be more increased. Accordingly, the bit-line sense amplifier may more stably perform the sensing operation.

The nonvolatile memory device 940 may store a boot image for booting the mobile system 900. For example, the nonvolatile memory device 940 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 930 may include at least one input device, such as a keypad, a touch screen, etc., and at least one output device, such as a speaker, a display device, etc. The power supply 960 may supply a power supply voltage to the mobile system 900. In some embodiments, the mobile system 900 may further include a camera image processor (CIS), and/or a storage device, such as a memory card, a solid state drive (SSD), a hard disk drive (HDD), a CD-ROM, etc.

In some embodiments, the mobile system 900 and/or components of the mobile system 900 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

FIG. 14 is a block diagram illustrating a computing system according to example embodiments.

Referring to FIG. 14, a computing system 1100 includes a processor 1110, an input/output hub (IOH) 1120, an input/output controller hub (ICH) 1130, at least one memory module 1140 and a graphics card 1150. In some embodiments, the computing system 1100 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 1110 may perform various computing functions, such as executing specific software for performing specific calculations or tasks. For example, the processor 1110 may be a microprocessor, a central process unit (CPU), a digital signal processor, or the like. In some embodiments, the processor 1110 may include a single core or multiple cores. For example, the processor 1110 may be a multi-core processor, such as a dual-core processor, a quad-core processor, a hexa-core processor, etc. Although FIG. 28 illustrates the computing system 1100 including one processor 1110, in some embodiments, the computing system 1100 may include a plurality of processors. The processor 1110 may include an internal or external cache memory.

The processor 1110 may include a memory controller 1111 for controlling operations of the memory module 1140. The memory controller 1111 included in the processor 1110 may be referred to as an integrated memory controller (IMC). The memory controller 1111 may include structure and/or perform the methods of one or more of the embodiments described herein. A memory interface between the memory controller 1111 and the memory module 1140 may be implemented with a single channel including a plurality of signal lines, or may bay be implemented with multiple channels, to each of which at least one memory module 1140 may be coupled. In some embodiments, the memory controller 1111 may be located inside the input/output hub 1120, which may be referred to as memory controller hub (MCH).

The memory module 1140 may include a plurality of semiconductor memory devices that store data provided from the memory controller 1111. Each of the semiconductor memory devices may include the memory core 10 of FIG. 1 to have the open bit-line structure, and more lowers the voltage of the bit-line BL and the complementary bit-line BLB, or performs a boosting operation with respect to the bit-line BL or the complementary bit-line BLB before charge sharing, so that the voltage difference between the bit-line BL and the complementary bit-line BLB may be more increased. Accordingly, the bit-line sense amplifier may more stably perform the sensing operation.

The input/output hub 1120 may manage data transfer between processor 1110 and devices, such as the graphics card 1150. The input/output hub 1120 may be coupled to the processor 1110 via various interfaces. For example, the interface between the processor 1110 and the input/output hub 1120 may be a front side bus (FSB), a system bus, a Hyper-Transport, a lightning data transport (LDT), a QuickPath interconnect (QPI), a common system interface (CSI), etc. Although FIG. 40 illustrates the computing system 1100 including one input/output hub 1120, in some embodiments, the computing system 1100 may include a plurality of input/output hubs. The input/output hub 1120 may provide various interfaces with the devices. For example, the input/output hub 1120 may provide an accelerated graphics port (AGP) interface, a peripheral component interface-express (PCIe), a communications streaming architecture (CSA) interface, etc.

The graphics card 1150 may be coupled to the input/output hub 1120 via AGP or PCIe. The graphics card 1150 may control a display device (not shown) for displaying an image. The graphics card 1150 may include an internal processor for processing image data and an internal memory device. In some embodiments, the input/output hub 1120 may include an internal graphics device along with or instead of the graphics card 1150 outside the graphics card 1150. The graphics device included in the input/output hub 1120 may be referred to as integrated graphics. Further, the input/output hub 1120 including the internal memory controller and the internal graphics device may be referred to as a graphics and memory controller hub (GMCH).

The input/output controller hub 1130 may perform data buffering and interface arbitration to efficiently operate various system interfaces. The input/output controller hub 1130 may be coupled to the input/output hub 1120 via an internal bus, such as a direct media interface (DMI), a hub interface, an enterprise Southbridge interface (ESI), PCIe, etc. The input/output controller hub 1130 may provide various interfaces with peripheral devices. For example, the input/output controller hub 1130 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1110, the input/output hub 1120 and the input/output controller hub 1130 may be implemented as separate chipsets or separate integrated circuits. In other embodiments, at least two of the processor 1110, the input/output hub 1120 and the input/output controller hub 1130 may be implemented as a single chipset.

As mentioned above, the voltage between the bit-line and the complementary bit-line is sufficiently lowered from the bit-line pre-charge voltage, or the boosting operation is performed with respect to the bit-line BL or the complementary bit-line BLB so that the voltage difference between the bit-line BL and the complementary bit-line is increased, before the word-line is enabled so that charge sharing occurs between the cell capacitor and the bit-line, by using at least one dummy equalization control signal that is disabled with a delay with respect to the equalization control signal. Accordingly, the sensing operation can be stably performed by increasing charge sharing voltage. Therefore, the operating characteristic of the semiconductor memory device can be improved.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims.

What is claimed is:
1. A semiconductor device comprising:
a first memory cell connected to a bit-line and a first word-line; and
a second memory cell connected to a complementary bit-line and a second word-line; and
an equalizer configured to transition a voltage of the bit-line and the complementary bit-line from a first voltage to a second voltage different from the first voltage at a first time period when the bit-line and complementary bit-line are floating, and configured to transition the voltage of at least one of the bit-line and the complementary bit-line from the second voltage to a third voltage at a second time period after the first time period when the bit-line and complementary bit-line are floating, the third voltage being different from the first and second voltages.

2. The semiconductor device of claim 1, further comprising:
a control signal generator configured to activate the first word line to alter the voltage on the bit-line in response to data stored in the first memory cell at a third time period after the second time period,
wherein the equalizer includes an equalizing circuit configured to transition the first voltage to the second voltage, and a coupling circuit configured to transition the second voltage to the third voltage.

3. The semiconductor device of claim 2, wherein the equalizing circuit comprises:
a first NMOS transistor connected between the bit-line and the complementary bit-line; and
second and third NMOS transistors connected in series between the bit-line and the complementary bit-line,
wherein the control signal generator is configured to apply an equalization control signal to gates of the first, second and third NMOS transistors.

4. The semiconductor device of claim 3, wherein the coupling circuit comprises:
a fourth NMOS transistor connected between the bit-line and the complementary bit-line,
wherein the control signal generator is configured to apply a coupling control signal to a gate of the fourth NMOS transistor.

5. The semiconductor device of claim 4, wherein the coupling circuit is configured to transition the second voltage to the third voltage in response to a transition of the coupling control signal from a high level to a low level.

6. The semiconductor device of claim 3, wherein the coupling circuit comprises:
a fourth NMOS transistor having a source connected to the complementary bit-line, a drain connected to the complementary bit-line, and a gate to which a coupling control signal is applied.

7. The semiconductor device of claim 6, wherein the coupling circuit is configured to transition the second voltage to the third voltage in response to a transition of the coupling control signal from the high level to the low level.

8. The semiconductor device of claim 6, wherein the fourth NMOS transistor is capacitively coupled to the complementary bit-line and is configured to operate as a negative boosting capacitor to the complementary bit-line in response to the coupling control signal.

9. The semiconductor device of claim 2, wherein the control signal generator is configured to generate first and second coupling control signals, and wherein the coupling circuit comprises:
a fourth NMOS transistor having a source connected to the complementary bit-line, and a drain connected to the complementary bit-line and a gate to which the first coupling control signal is applied; and
a fifth NMOS transistor having a source connected to the bit-line and a drain connected to the bit-line and a gate to which the second coupling control signal is applied.

10. The semiconductor device of claim 9, wherein the fourth NMOS transistor is configured to transition the second voltage to the third voltage in response to a transition of the first coupling control signal from a high level to a low level, and
wherein the fifth NMOS transistor is configured to transition the second voltage to a fourth voltage in response to a transition of the second coupling control signal from a low level to a high level, the fourth voltage being different from the first, second and third voltages.

11. The semiconductor device of claim 9, wherein the fourth NMOS transistor is capacitively coupled to the complementary bit-line and is configured to operate as a negative boosting capacitor to the complementary bit-line in response to the first coupling control signal, and the fifth NMOS transistor is capacitively coupled to the bit-line and is configured to operate as a positive boosting capacitor to the bit-line in response to the second coupling control signal.

12. A semiconductor memory device comprising:
a memory core including a first memory cell connected to a first bit-line and a first word-line, and a control signal generator, the memory core configured to:
equalize voltage levels of the first bit-line and a second bit-line different from the first bit-line;
activate the first word-line;
amplify a voltage difference between the first bit-line and the second bit-line, and
provide the amplified voltage difference to a local input/output (I/O) line pair;
a local sense amplifier configured to amplify a voltage signal of the local input/output line pair and configured to provide the voltage signal to a global I/O line pair;
an I/O sense amplifier configured to amplify a voltage signal of the global I/O line pair; and
an I/O buffer configured to buffer and to output an output signal of the I/O sense amplifier, or configured to buffer input data,
wherein the control signal generator is configured to transition the equalized voltage level of the first and second bit-lines at least two times while the first and second bit-lines are floating.

13. The semiconductor memory device of claim 12, wherein the memory core further comprises:
an equalizing circuit configured to equalize to a first voltage having a first voltage level at the first bit-line and the second bit-line, and to transition the first voltage to a second voltage having a second voltage level different from the first voltage level; and
a coupling circuit configured to transition the second voltage to a third voltage having a third voltage level different from the first and second voltage levels.

14. The semiconductor memory device of claim 13, wherein the control signal generator is configured to generate a first control signal to cause the equalizing circuit to equalize to the first voltage of the first and second bit-lines and to transition the first voltage to the second voltage, and
wherein the control signal generator is configured to generate a second control signal to cause the coupling circuit to transition the second voltage to the third voltage.

15. The semiconductor memory device of claim 13, wherein the coupling circuit includes a first NMOS transistor having a source connected to the second bit-line, a drain connected to the second bit-line, and a gate that receives the second control signal.

16. A method of operating a memory device including a memory cell array having a plurality of memory cells connected to word-lines and bit-lines, the method comprising:
causing a first bit-line and a second bit-line at a first time period, to have a first voltage;
at a second time period after the first time period, causing the first bit-line and the second bit-line to transition from the first voltage to a second voltage different from the first voltage;
at a third time period after the second time period, causing at least one of the first bit-line and second bit-line to transition from the second voltage to a third voltage different from the first and second voltages; and
at a fourth time period after the third time period, causing one of the first and second bit-lines to share charge with a selected memory cell by selecting a corresponding word-line operatively connected to the selected memory cell.

17. The method of claim 16, wherein the second voltage is less than the third voltage.

18. The method of claim 16, wherein the transition to the second voltage is responsive to a transition of an equalization control signal from a first logic level to a second logic level opposite to the first logic level.

19. The method of claim 18, wherein the transition to the third voltage is responsive to a transition of a coupling control signal to the second logic level, and
wherein the transition of the coupling control signal occurs after the transition of the equalization control signal.

20. The method of claim 16, wherein the transitions to the second and third voltages occur between deactivating the equalizing and activating the corresponding word-line.

* * * * *